US010176001B2

(12) United States Patent
Toyama et al.

(10) Patent No.: US 10,176,001 B2
(45) Date of Patent: Jan. 8, 2019

(54) SIMULATION DEVICE, SIMULATION METHOD, AND COMPUTER READABLE MEDIUM

(71) Applicant: MITSUBISHI ELECTRIC CORPORATION, Tokyo (JP)

(72) Inventors: Osamu Toyama, Tokyo (JP); Koji Nishikawa, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 15/564,398

(22) PCT Filed: May 28, 2015

(86) PCT No.: PCT/JP2015/065374
§ 371 (c)(1),
(2) Date: Oct. 4, 2017

(87) PCT Pub. No.: WO2016/189725
PCT Pub. Date: Dec. 1, 2016

(65) Prior Publication Data
US 2018/0136956 A1 May 17, 2018

(51) Int. Cl.
*G06F 9/455* (2018.01)
*G06F 11/14* (2006.01)
(Continued)

(52) U.S. Cl.
CPC ............ *G06F 9/455* (2013.01); *G06F 8/4441* (2013.01); *G06F 11/28* (2013.01);
(Continued)

(58) Field of Classification Search
CPC ............ G06F 9/45504; G06F 9/45533; G06F 9/30036; G06F 9/30043; G06F 9/3824;
(Continued)

(56) References Cited

U.S. PATENT DOCUMENTS 5,790,825 A * 8/1998 Traut .................. G06F 9/45504
703/26
8,666,723 B2 * 3/2014 Xie ........................ G06F 9/455
703/13
(Continued)

FOREIGN PATENT DOCUMENTS

| JP | 2012-3761 A | 1/2012 |
| JP | 2014-194746 A | 10/2014 |
| JP | 2014-241031 A | 12/2014 |

OTHER PUBLICATIONS

Kersey et al., A universal parallel front-end for execution driven microarchitecture simulation, 8 pages (Year: 2012).*
(Continued)

*Primary Examiner* — Thuy Dao
(74) *Attorney, Agent, or Firm* — Birch, Stewart, Kolasch & Birch, LLP

(57) ABSTRACT

A simulation device being a "host" simulates execution of a program in a "guest" using a cache for reading instructions in the program. In the simulation device, an execution unit executes instructions described in host code stored in a buffer. When host code wherein a next instruction being an instruction to be executed by the execution unit next is described is not stored in the buffer, a processing unit reads from a storage medium a guest code group with a size of a cache line, including guest code wherein the next instruction is described, converts the guest code group read, generates a host code group including the host code wherein the next instruction is described, and collectively writes the host code group generated, as a host code block, in the buffer.

7 Claims, 5 Drawing Sheets

(51) Int. Cl.
*G06F 11/34* (2006.01)
*G06F 11/28* (2006.01)
*G06F 8/41* (2018.01)
*G06F 12/0893* (2016.01)
*G06F 17/50* (2006.01)

(52) U.S. Cl.
CPC ...... *G06F 11/3457* (2013.01); *G06F 12/0893* (2013.01); *G06F 17/5009* (2013.01)

(58) Field of Classification Search
CPC .......... G06F 9/30189; G06F 8/52; G06F 8/51; G06F 9/45558; G06F 9/455; G06F 12/1009; G06F 12/0893; G06F 2009/45583; G06F 8/4441
See application file for complete search history.

(56) References Cited

U.S. PATENT DOCUMENTS

| | | | | |
|---|---|---|---|---|
| 9,122,634 B2* | 9/2015 | Farrell | ................ | G06F 11/0712 |
| 9,389,897 B1* | 7/2016 | Busaba | ............... | G06F 9/45558 |
| 9,785,454 B2* | 10/2017 | van de Kamp | ......... | G06F 9/455 |
| 2002/0133810 A1* | 9/2002 | Giles | ................... | G06F 9/45533 |
| | | | | 717/138 |
| 2007/0261038 A1* | 11/2007 | Suba | ........................ | G06F 8/51 |
| | | | | 717/136 |
| 2009/0157377 A1* | 6/2009 | Altman | ............... | G06F 9/45537 |
| | | | | 703/20 |
| 2011/0307876 A1 | 12/2011 | Ottoni et al. | | |
| 2012/0173851 A1* | 7/2012 | Lewis | .................... | G06F 12/10 |
| | | | | 712/208 |
| 2014/0244232 A1 | 8/2014 | Ogawa et al. | | |
| 2014/0365735 A1 | 12/2014 | Kuwamura | | |
| 2015/0324213 A1* | 11/2015 | Abdallah | ............ | G06F 9/45525 |
| | | | | 717/151 |

OTHER PUBLICATIONS

Arya et al., Tesseract: reconciling guest I/O and hypervisor swapping in a VM, 14 pages (Year: 2014).*

Nakada et al., "Fast Cache Simulation Using Workload Optimization", IPSJ SIG Notes, Aug. 4, 2005, vol. 2005, No. 80, pp. 97-102.

* cited by examiner

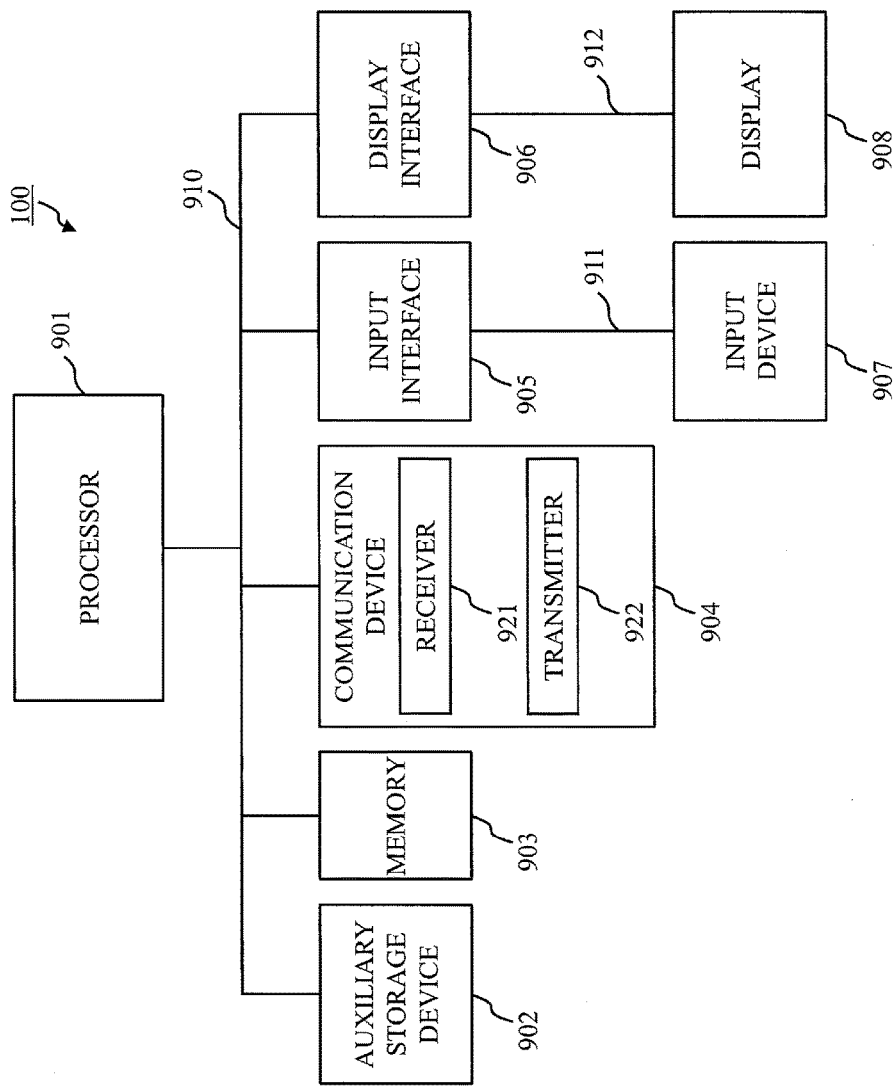

SIMULATION DEVICE, SIMULATION METHOD, AND COMPUTER READABLE MEDIUM

TECHNICAL FIELD

The present invention relates to a simulation device, a simulation method, and a simulation program.

BACKGROUND ART

When a system using electronic devices, especially an embedded system, is developed, the development of both hardware and software is necessary. However, generally, software cannot be operated unless hardware to execute the software is completed. Thus, when developing a system involving the development of both software and hardware, conventionally, a method has been adopted wherein hardware that constitutes the system is completed beforehand, and then the software is operated on the hardware completed to check the operation of the entire system.

In the conventional development flow as mentioned above, the operation verification of the entire system including the software is performed in an ending part of the development process. Thus, a potential problem exists that there is a great risk of rework in case any failure is detected. The potential risk affects the quality and development cost of the system more as the system gets larger and more complicated.

In recent years, electronic components have been miniaturized and made to offer high performance due to development of electronics, meanwhile a system to be composed by using electronic components has become large and complicated. Therefore, it has become difficult to ignore the potential risk in the conventional development flow as described above. In order to bypass the risk, in recent years, emulation techniques using an instruction set simulator (ISS) have been receiving a lot of attention. The ISS simulates the operation of an arbitrary processor and peripheral devices on a computer, and the ISS can execute arbitrary software by the processor and the peripheral devices simulated on the computer. Thus, it is possible to check operation of software to be installed on a system before completion of hardware that constitutes the system. That is, by using the ISS, it becomes possible to verify software before completion of hardware, which has been impossible by the conventional development flow. Further, it is possible not only to verify operation of software, but also to check operation and measure performance of a hardware architecture determined in an early stage of development. Accordingly, by a front-loading method, it is possible to bypass a risk of any failure in a downstream process which has potentially existed in the conventional development flow.

An ISS is realized as software that operates on a host being an arbitrary computer when execution of guest code being an arbitrary program is simulated. Therefore, when execution of a program in a great system is simulated by an ISS, it is the execution speed that matters.

There are several methods that are proposed for improving the execution speed.

Patent Literature 1 describes a method for speeding up execution of an ISS by improving efficiency of register mapping at the time when the ISS is executed by dynamic binary translation.

Patent Literature 2 describes a method to simulate peripheral devices, especially mediation of busses in order to utilize an ISS not only for operation verification of software but also for performance analysis of a system.

CITATION LIST

Patent Literature

Patent Literature 1: JP 2012-3761 A
Patent Literature 2: JP 2014-194746 A

SUMMARY OF INVENTION

Technical Problem

By making a processor to include a cache, execution speed of software is improved by several times to ten times or so compared to a case without a cache. Thus, in order to measure performance of a system with accuracy while speeding up execution of an ISS, it is necessary to simulate operation using a cache with accuracy, at a high speed. However, by the method described in Patent Literature 1, it is impossible to measure performance of a system. In the method described in Patent Literature 2, it is possible to measure the performance of the system; however, it is not considered to execute a cache simulation at a high speed.

The present invention is aimed at simulating operation using a cache at a high speed with accuracy.

Solution to Problem

A simulation device according to one aspect of the present invention is to simulate execution of a program in a system using a cache for reading an instruction in the program, the simulation device comprising:
a storage medium to store guest code wherein the instruction in the program is described in an executable form in the system;
a buffer to store host code wherein the instruction in the program is described in an executable form in the simulation device;
an execution unit to execute the instruction described in the host code stored in the buffer; and
a processing unit, when host code wherein a next instruction being an instruction to be executed by the execution unit next is described is not stored in the buffer, to read from the storage medium a guest code group with a size of a cache line being a unit whereby the instruction in the program is stored in the cache, the guest code group including guest code wherein the next instruction is described, to convert the guest code group read, to generate a host code group including the host code wherein the next instruction is described, and to collectively write the host code group generated, as a host code block, in the buffer.

Advantageous Effects of Invention

In the present invention, when guest code is converted into host code, by converting a guest code group with a size of a cache line into a host code group, and writing the host code group collectively into a buffer as a host code block, it is possible to simulate the operation using a cache at a high speed with accuracy.

BRIEF DESCRIPTION OF DRAWINGS

FIG. 5 is a diagram illustrating a hardware configuration example of the simulation device according to the embodiment of the present invention.

DESCRIPTION OF EMBODIMENTS

Hereinafter, an embodiment of the present embodiment will be described by using diagrams. Note that, in each diagram, the same parts or corresponding parts are denoted by the same signs. In the explanation of the embodiment, description of the same parts or corresponding parts will be omitted or simplified as needed.

First Embodiment

The configuration of a device according to the present embodiment, the operation of the device according to the present embodiment, and the effects of the present embodiment will be described in turn.

* Explanation of Configuration *

Figure 1:
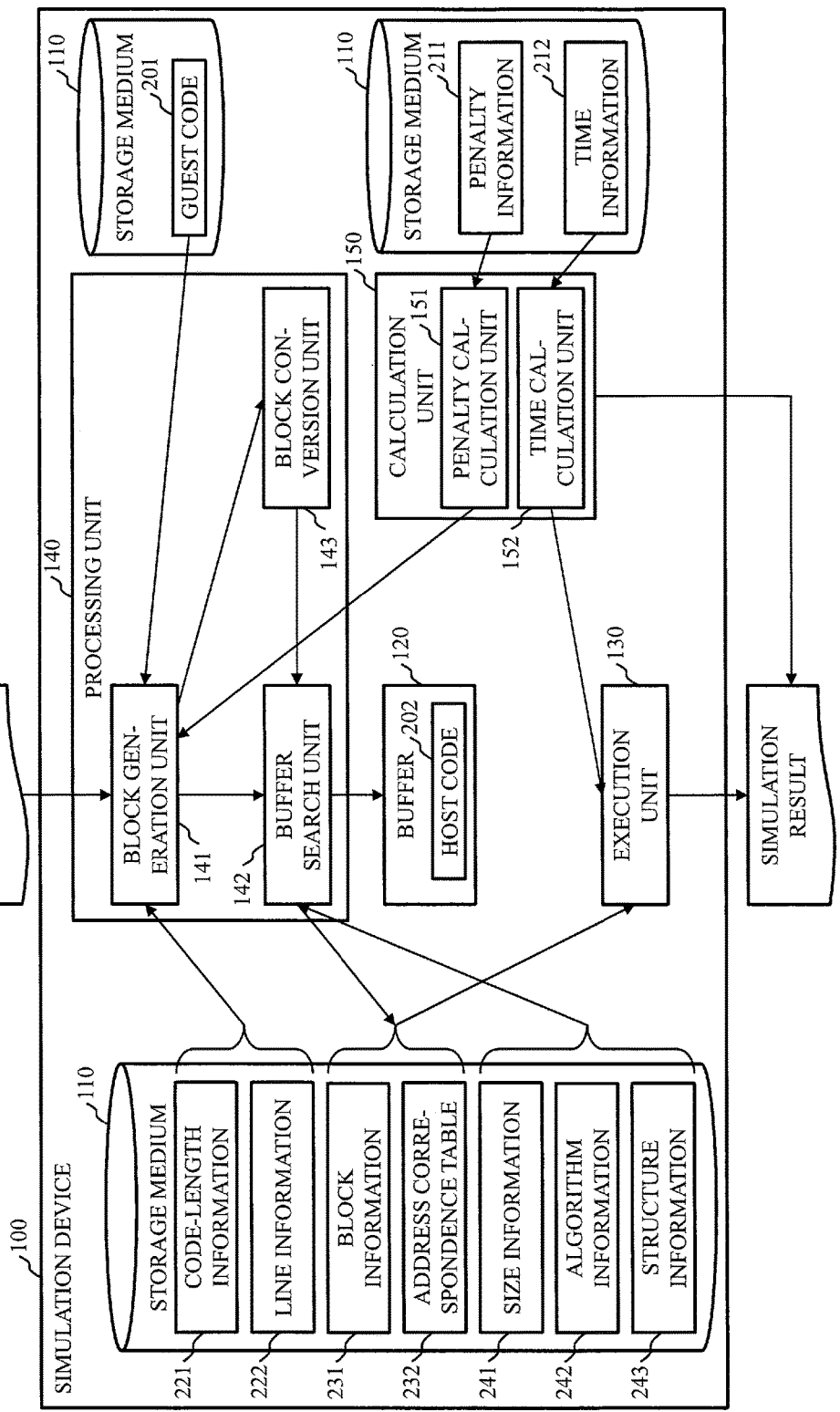
FIG. 1 is a block diagram illustrating a configuration of a simulation device according to a first embodiment.

With reference to FIG. 1, a configuration of a simulation device 100 as the device according to the present embodiment will be described.

The simulation device 100 is a computer to measure the performance of a system by executing an ISS. That is, the simulation device 100 corresponds to a "host." The system, the performance of which is measured by the simulation device 100, corresponds to a "guest."

In the system as the "guest," a processor executes a program by reading instructions in the program from a memory, and executing the instructions read. A cache is used at the time when the instructions are read by the processor. That is, the "guest" is a system using the cache for reading the instructions in the program.

The program consists of a plurality of pieces of guest code 201. The plurality of pieces of guest code 201 are code described in a form whereby the instructions in the program are executable in the "guest," i.e., in an executable form in the "guest."

The simulation device 100 as the "host" simulates execution of the program in the "guest," and calculates an estimated value 301 of the execution time of the program in the "guest." The simulation device 100 converts each piece of the guest code 201 into host code 202 in order to simulate execution of the program consisting of the plurality of pieces of guest code 201. The host code 202 is code described in a form whereby the instructions in the program are executable in the "host," i.e., in an executable form in the "host." In the present embodiment, the host code 202 is binary code.

In the present embodiment, when the guest code 201 is converted into the host code 202, the simulation device 100 as the "host" converts a guest code group with a size of a cache line into a host code group, and writes the host code group collectively as a host code block into a buffer 120. In this manner, it becomes possible to simulate the operation using the cache at a high speed with accuracy.

As illustrated in FIG. 1, the simulation device 100 includes a storage medium 110 and the buffer 120.

The storage medium 110 stores the guest code 201 and penalty information 211. The guest code 201 is, as described above, code wherein the instructions in the program are described in the executable form in the system being the "guest." The penalty information 211 is information indicating a read time of the instructions in the program in the "guest" when a miss occurs in the cache. That is, the penalty information 211 is information indicating cache penalty.

The storage medium 110 further stores time information 212. The time information 212 is information indicating a time taken for executing the instructions in the program in the system being the "guest." That is, the time information 212 is information indicating an instruction execution time.

The storage medium 110 further stores code-length information 221, line information 222, block information 231, an address correspondence table 232, size information 241, algorithm information 242 and structure information 243. The code-length information 221 is information indicating the size of the guest code 201. The line information 222 is information indicating the size of the cache line. The cache line is a unit whereby the instructions in the program are stored in the cache. The block information 231 is information indicating an attribute of a guest code block to be described below. The address correspondence table 232 is a table recording in which address of the buffer 120 a host code block to be described below is stored. The size information 241 is information indicating the size of the cache. The algorithm information 242 is information indicating what algorithm is used in the "guest" as a replacement algorithm of the cache line. The structure information 243 is information indicating what structure is used in the "guest" as a data storage structure of the cache.

The buffer 120 is a memory for storing the host code 202. The host code 202 is, as described above, the code wherein the instructions in the program are described in the executable form in the simulation device 100 being the "host."

In the present embodiment, the buffer 120, the host code 202 and the host code block of the simulation device 100 being the "host" correspond respectively to the cache, the guest code 201 and the guest code block of the system being the "guest." In the present embodiment, by making the operation related to the buffer 120 close to the operation related to the cache, the accuracy of simulation is improved.

The simulation device 100 further includes an execution unit 130, a processing unit 140 and a calculation unit 150.

The execution unit 130 executes the instructions described in the host code 202 stored in the buffer 120.

Specifically, the execution unit 130 obtains an address inside the buffer 120 of a host code block wherein an instruction to be executed next is described, from the address correspondence table 232 stored in the storage medium 110. The execution unit 130 specifies the address obtained, and obtains the host code block from the buffer 120. The execution unit 130 executes the host code block obtained. To "execute the host code block" means to execute the instruction described in each piece of the host code 202 included in the host code block.

When host code 202 wherein the next instruction being the instruction to be executed by the execution unit 130 next is described is not stored in the buffer 120, the processing unit 140 reads from the storage medium 110 a guest code group with a size of a cache line including guest code 201 wherein the next instruction is described. The processing unit 140 converts the guest code group read, and generates a host code group including the host code 202 wherein the next instruction is described. The processing unit 140 collectively writes the host code group generated, as a host code block, in the buffer 120.

In this manner, by conforming the unit whereby the host code 202 is stored in the buffer 120 to the cache line, it becomes possible to simulate the operation of the cache with high accuracy. Further, when the host code 202 wherein the instruction to be executed next is described is stored in the buffer 120, by using the host code 202, it is possible to omit a process to generate host code 202; hence, simulation can be accelerated.

Note that the processing unit 140 may convert the guest code 201 into the host code 202 one piece by one piece; however, in the present embodiment, the processing unit 140 generates a guest code block from the guest code 201 with the same quantity as the size of the cache line, and converts the guest code block into a host code block at once.

In the present embodiment, by comparing a total size of the guest code corresponding to one or more host code blocks stored in the buffer 120 with the size of the cache (of the guest system), the processing unit 140 judges whether a free space for storing the host code group generated exists in the buffer 120. When the free space does not exist, the processing unit 140 deletes any of the host code blocks from the buffer 120. As described above, by judging whether a free space exists based not on an actual capacity of the buffer 120 but on a capacity of the cache in the "guest," it becomes possible to simulate the operation of the cache with high accuracy. Note that the "guest code corresponding to one or more host code blocks" is the pieces of the guest code from which the host code blocks originate.

When any of the host code blocks is deleted from the buffer 120 as described above, the processing unit 140 uses an algorithm same as an algorithm whereby the system being the "guest" deletes one or some instructions from the cache when a miss occurs in the cache. Accordingly, it becomes possible to simulate the operation of the cache with higher accuracy.

In the present embodiment, the processing unit 140 includes a block generation unit 141, a buffer search unit 142 and a block conversion unit 143.

The block generation unit 141 specifies an address and obtains the guest code 201 from the storage medium 110. The block generation unit 141 refers to the code-length information 221 stored in the storage medium 110, and obtains a numerical value of the size of the guest code 201. The block generation unit 141 refers to the line information 222 stored in the storage medium 110, and obtains the numerical value of the size of the cache line. The block generation unit 141 uses the numerical values obtained, and generates a guest code block from the guest code 201. The block generation unit 141 outputs the guest code block generated to the block conversion unit 143. The block generation unit 141 outputs the block information 231 about the guest code block generated to the buffer search unit 142.

The buffer search unit 142 obtains the block information 231 from the block generation unit 141. The buffer search unit 142 writes the block information 231 into the storage medium 110. The buffer search unit 142 obtains a host code block from the block conversion unit 143. The buffer search unit 142 stores the host code block obtained in the buffer 120. The buffer search unit 142 records into the address correspondence table 232 an address where the host code block is stored in the buffer 120. When a free space for storing the host code block does not exist in the buffer 120, the buffer search unit 142 refers to the size information 241, algorithm information 242 and structure information 243 stored in the storage medium 110 in order to determine a method to create a free space.

The block conversion unit 143 obtains the guest code block from the block generation unit 141. The block conversion unit 143 converts the guest code block into the host code block, and outputs the host code block to the buffer search unit 142.

The calculation unit 150 calculates an estimated value 301 of an execution time of the program in the "guest." At the time, the calculation unit 150 adds the read time indicated by the penalty information 211 stored in the storage medium 110 to the estimated value 301 every time a new host code block is written into the buffer 120.

Note that the timing when the read time is added by the calculation unit 150 may be before when a new host code block is written into the buffer 120, may be at the same time as when a new host code block is written into the buffer 120, or may be after when a new host code block is written into the buffer 120. In any case, the read time is added "every time a new host code block is written into the buffer 120." That is, a new host code block is written into the buffer 120 by the processing unit 140 when a situation occurs that the host code 202 describing an instruction to be executed next by the execution unit 130 is not stored in the buffer 120; hence, the calculation unit 150 may add the read time anytime once it is detected that such a situation occurs. Therefore, in the present embodiment, the calculation unit 150, without waiting for a new host code block to be written into the buffer 120, adds the read time at the time when it is detected that a guest code block with a size of the cache line is obtained from the storage medium 110 by the processing unit 140.

As described above, in the present embodiment, a host code group corresponding to a guest code group with the same quantity as the size of the cache line is collectively written into the buffer 120 as a host code block. Therefore, the calculation unit 150 adds the read time indicated by the penalty information 211 to the estimated value 301 every time a host code block is written into the buffer 120.

The penalty information 211 is preferably information indicating a time taken for reading the instructions in the program in the system being the "guest" when a miss occurs in the cache, per address range of the memory from which the instructions in the program are read. By using such information, a time to be added to the estimated value 301 by the calculation unit 150 becomes a time more conformed to reality, not being a uniform time; hence, it is possible to obtain an estimated value 301 with higher accuracy.

The calculation unit 150 further adds the time indicated by the time information 212 stored in the storage medium 110 to the estimated value 301 every time an instruction described in the host code 202 stored in the buffer 120 is executed by the execution unit 130.

In the present embodiment, the calculation unit 150 includes a penalty calculation unit 151 and a time calculation unit 152.

The penalty calculation unit 151 monitors the operation of the block generation unit 141. When the block generation unit 141 obtains a guest code group with a size of the cache line from the storage medium 110, the penalty calculation unit 151 refers to the penalty information 211 stored in the storage medium 110, and adds a cache penalty to the estimated value 301.

The time calculation unit 152 monitors the operation of the execution unit 130. When the execution unit 130 executes a host code block, the time calculation unit 152 refers to the time information 212 stored in the storage medium 110, and adds an instruction execution time to the estimated value 301.

* Explanation of Operation *

Figure 2:
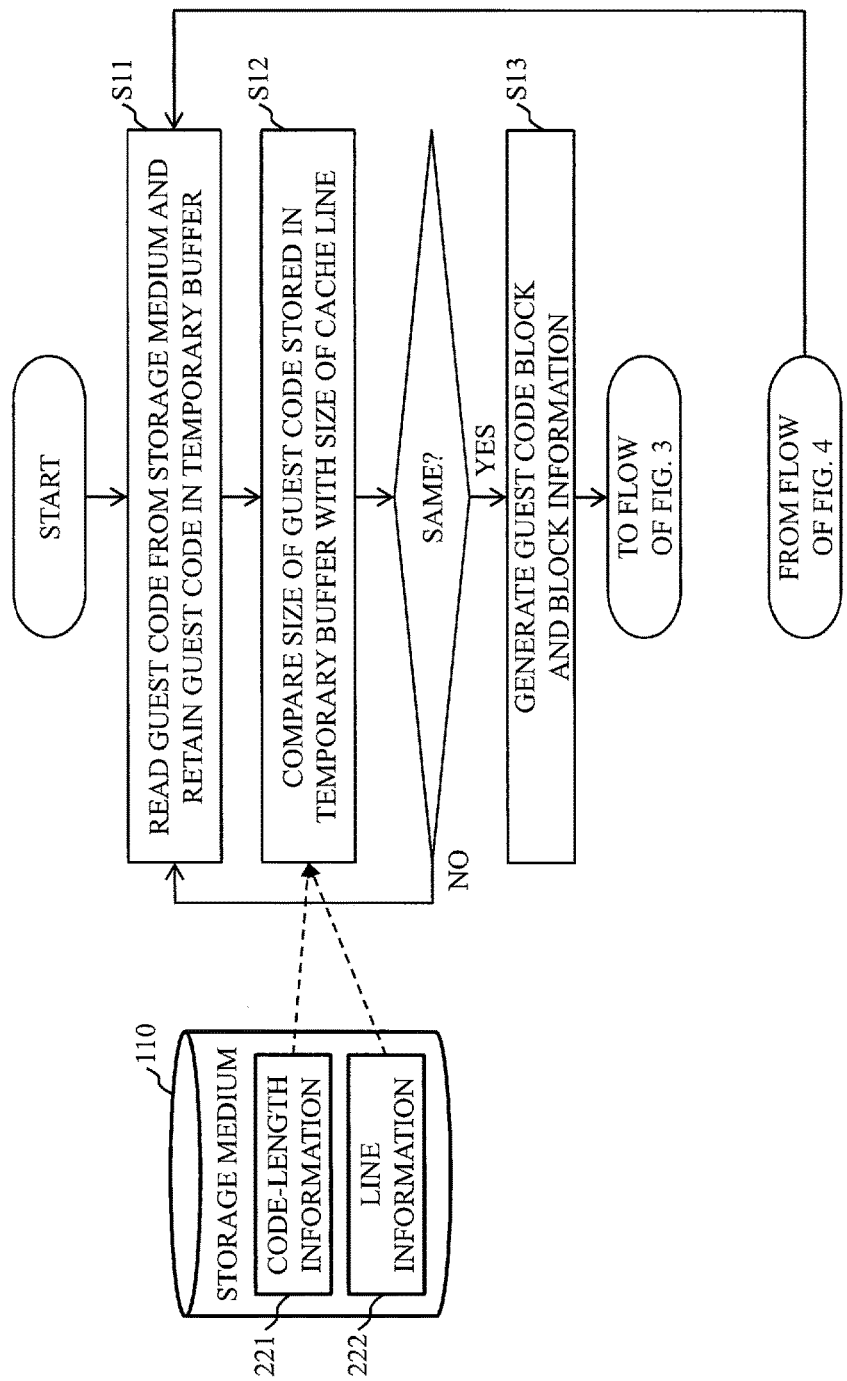
FIG. 2 is a flowchart illustrating operation of the simulation device according to the first embodiment.
Figure 3:
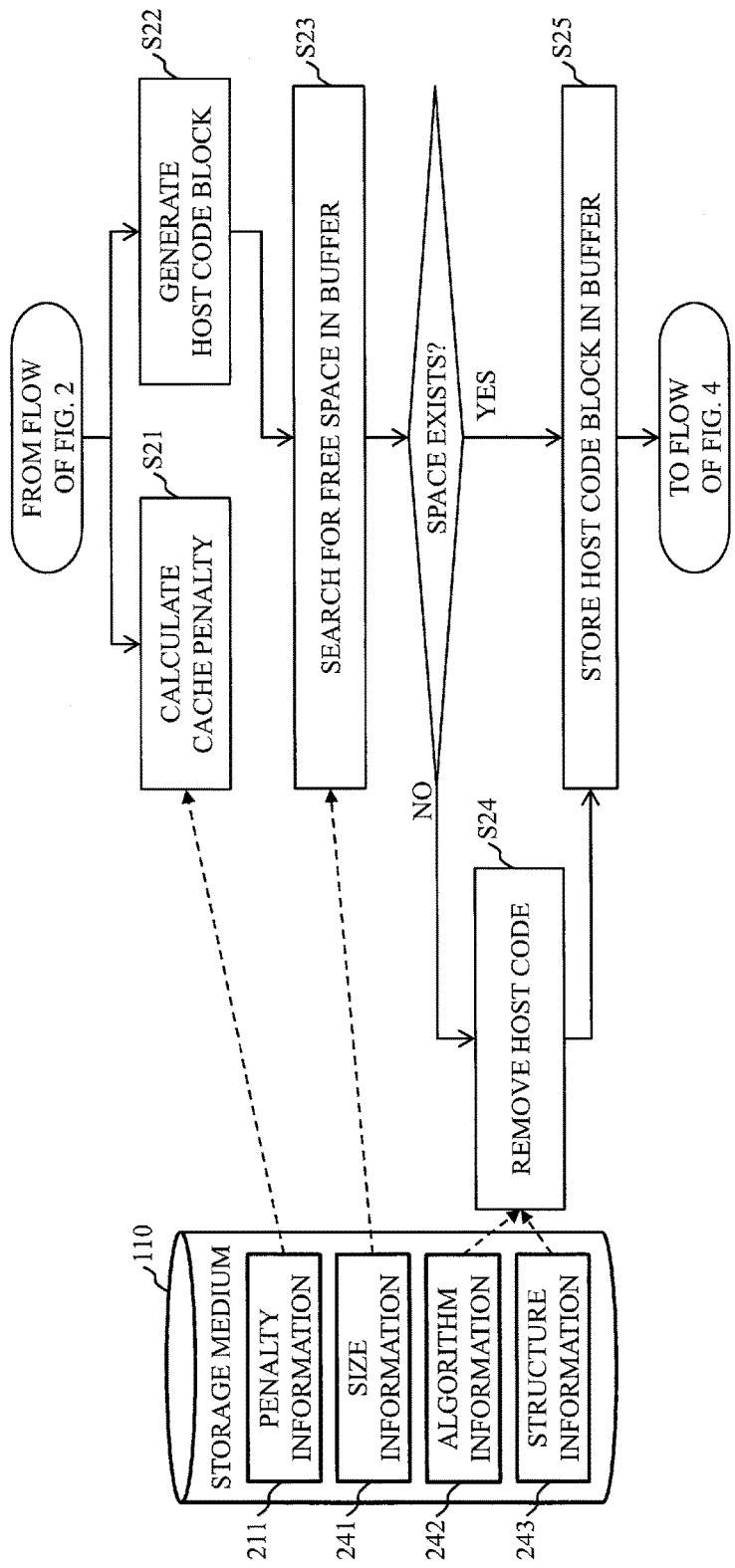
FIG. 3 is a flowchart illustrating the operation of the simulation device according to the first embodiment.
Figure 4:
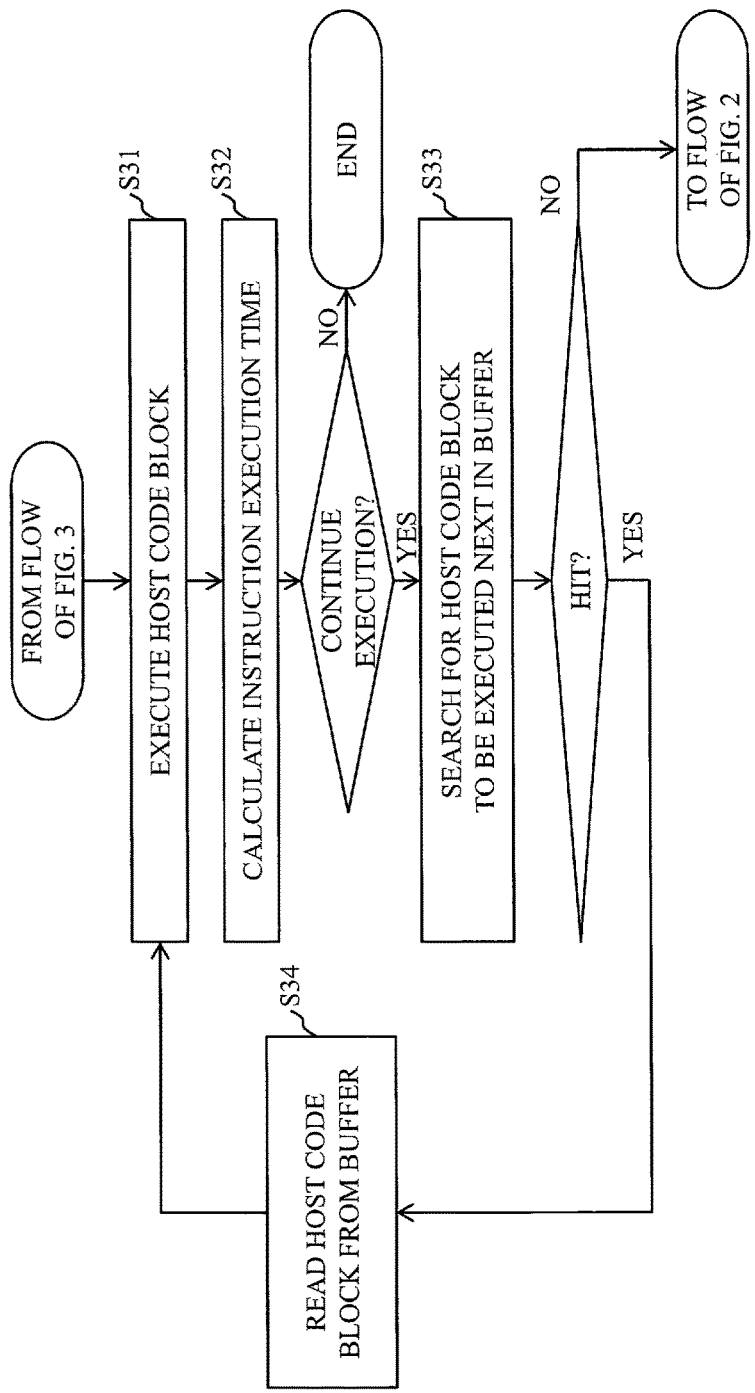
FIG. 4 is a flowchart illustrating the operation of the simulation device according to the first embodiment.

With reference to FIG. 2, FIG. 3 and FIG. 4, the operation of the simulation device 100 will be described. The operation of the simulation device 100 corresponds to a simulation method according to the present embodiment. The operation of the simulation device 100 corresponds to a processing procedure of a simulation program according to the present embodiment.

FIG. 2 illustrates a procedure of the simulation device 100 to generate a guest code block. Among the components illustrated in FIG. 1, the storage medium 110 and the block generation unit 141 in the processing unit 140 especially relate to the procedure.

Prior to carrying out a step S11, guest code 201 is stored in the storage medium 110. When the block generation unit 141 receives a direction of a start address from outside, a flow starts from the step S11.

In the step S11, in accordance with the address directed, the block generation unit 141 specifies an address for reading guest code 201 to the storage medium 110. The storage medium 110 returns the guest code 201 stored in the address specified. The block generation unit 141 checks a code length of the guest code 201 returned by referring to code-length information 221, and retains the guest code 201 in a temporary buffer not illustrated.

In a step S12, the block generation unit 141 refers to line information 222, and checks whether a total code length of the guest code 201 retained in the temporary buffer is the same as the size of a cache line. The size of the cache line is the size of a cache line of a cache included in the system being the "guest."

As a result of checking in the step S12, when the total code length of the guest code 201 retained in the temporary buffer is not the same as the size of the cache line, the flow returns to the step S11. When it is the same, the flow proceeds to a step S13.

In the step S13, the block generation unit 141 outputs a group of the guest code 201 inside the temporary buffer collectively as one guest code block. Simultaneously, the block generation unit 141 outputs the information about the guest code block as block information 231. The block information 231 includes a quantity and a total code length of the guest code 201 included in the guest code block, address information of each piece of the guest code 201, etc.

FIG. 3 illustrates a procedure of the simulation device 100 to calculate a processing time in a case wherein reading of the guest code performed in the flow of FIG. 2 is executed by actual hardware, and a procedure of the simulation device 100 to convert a guest code block into a host code block, and store the host code block into the buffer 120. Among the components illustrated in FIG. 1, the storage medium 110, the buffer 120, the buffer search unit 142 in the processing unit 140, the block conversion unit 143 in the processing unit 140, and the penalty calculation unit 151 in the calculation unit 150 especially relate to the procedures.

In a step S21, the penalty calculation unit 151 calculates a cache penalty by referring to block information 231 generated by the block generation unit 141, and the penalty information 211. The cache penalty is a read time required when a plurality of pieces of the guest code 201 included in the guest code block are read on actual hardware. In the actual hardware, the guest code 201 is placed on a memory. In order to read the guest code 201 from the memory, reading latency different depending on memory performance is required. The reading latency is a read time. The penalty information 211 is information wherein the reading latency is made into a database by relating the reading latency with an address map defined in the actual hardware. Therefore, the penalty calculation unit 151 extracts reading latency corresponding to an address included in the penalty information 211 by using the address information of the guest code 201 included in the block information 231 as a key. The penalty calculation unit 151 calculates a read time of when a plurality of pieces of the guest code 201 included in the guest code block is read on the actual hardware, from the reading latency extracted.

Along with the step S21, in a step S22, the block conversion unit 143 converts the form of the guest code block into an executable form in the "host," and generates a host code block.

In a step S23, the buffer search unit 142 searches for a free space in the buffer 120 for storing the host code block generated by the block conversion unit 143. In searching, the buffer search unit 142 judges whether there is a space as a difference between a total size of guest code corresponding to the host code block currently recorded in the buffer 120 and a size of the cache indicated by the size information 241, not whether there is a free space in the buffer 120 itself. When the total size of the guest code corresponding to the host code block is smaller than the size of the cache, there is a space. Note that the buffer 120 itself may be of any size as long as it is larger than the size of the cache.

When there is no free space in the buffer 120, the flow proceeds to a step S24. When there is a free space in the buffer 120, the flow proceeds to a step S25.

In the step S24, the buffer search unit 142 refers to the algorithm information 242 and the structure information 243, and creates a free space by removing a host code block from the buffer 120. The algorithm information 242 is information indicating whether a cache line replacement method to be used in the "guest" is any of the least recently used (LRU) algorithm, the least frequently used (LFU) algorithm, etc. The structure information 243 is information indicating whether the data storage structure of the cache used in the "guest" is any of the direct mapped structure, the set associative structure, the fully associative structure, etc. The structure information 243 includes information of the number of ways, the number of banks, etc. as well depending on the adopted structure.

After the step S24, the flow proceeds to the step S25.

In the step S25, the buffer search unit 142 stores the host code block generated by the block conversion unit 143 in a free space in the buffer 120. The buffer search unit 142 records in the address correspondence table 232 block information 231 of a guest code block as a conversion source of the host code block, and an address where the host code block is stored in the buffer 120 as a pair. The information recorded here is used in a flow of FIG. 4.

FIG. 4 illustrates procedures of the simulation device 100 to execute a host code block, and to calculate a processing time in a case wherein guest code is executed on actual hardware. Among the components illustrated in FIG. 1, the storage medium 110, the buffer 120, the execution unit 130, the buffer search unit 142 in the processing unit 140, and the time calculation unit 152 in the calculation unit 150 especially relate to the procedures.

In a step S31, the buffer search unit 142 outputs the host code block stored in the buffer 120 to the execution unit 130. The execution unit 130 executes by a central processing unit (CPU) of the "host" the host code block input, and outputs a simulation result of the operation in a case wherein the guest code block as a conversion source of the host code block is executed on the actual hardware. Note that the execution unit 130 executes host code 202 until the last piece of the host code 202 included in the host code block currently being executed, or until a piece of the host code 202 just before a jump to an address outside of the host code block currently being executed due to a branch instruction or jump instruction.

In a step S32, the time calculation unit 152 refers to the block information 231 of the guest code block corresponding to the host code block executed by the execution unit 130, and the time information 212, and calculates an instruction execution time in a case wherein the guest code block is executed on the actual hardware. Note that it is preferable that the step S31 and the step S32 are carried out concurrently.

The execution unit 130 checks if the end of the host code block executed in the step S31 has been reached. If the end has been reached, the flow ends. That is, simulation is completed. When the end has not been reached, and continuation of the execution of simulation is necessary, the flow proceeds to a step S33.

In the step S33, the execution unit 130 notifies the buffer search unit 142 of an address of host code to be executed next as a jump destination address in addition to completion of the execution of the current host code block.

In a step S34, the buffer search unit 142 refers to the address correspondence table 232, and searches for a host code block corresponding to the jump destination address notified by the execution unit 130 in the buffer 120.

As a result of search, when the pertinent host code block exists in the buffer 120, the flow proceeds to the step S34. This can be regarded as an occurrence of a cache hit. As a result of search, when the pertinent host code block does not exist in the buffer 120, the flow returns to the step S11. This can be regarded as an occurrence of a cache miss.

In the step S34, the buffer search unit 142 retrieves the host code block from the buffer 120 and outputs the host code block to the execution unit 130.

After the step S34, the flow returns to the step S31.

* Explanation of Effects *

In the present embodiment, when guest code 201 is converted into host code 202, by converting a guest code group with a size of a cache line into a host code group, and writing the host code group collectively into the buffer 120 as a host code block, it is possible to simulate the operation using a cache at a high speed with accuracy.

In the present embodiment, when a host code block to be executed next exists in the buffer 120, the flows of FIG. 2 and FIG. 3 can be skipped. Therefore, it is possible to execute simulation at a high speed. Further, the operation of space search in the buffer 120 is equivalent to the operation of cache search in actual hardware. Further, the operation of reading the guest code 201 in the flow of FIG. 2 is equivalent to the operation of accessing an external memory when a cache miss occurs in actual hardware. Therefore, only by monitoring these operations and calculating times through replacing these operations with operation in actual hardware, it is possible to measure performance of a system including operations of a cache hit and a cache miss, at a high speed with accuracy.

In actual hardware, instructions are placed by a line size unit in a cache. If it is intended to perform conversion from guest code 201 to host code 202 in a unit different from that of a line size, cumbersome operations as follow become necessary in order to judge a cache hit and a cache miss.

(1) Calculate what size of guest code 201 is included in a pre-conversion code group corresponding to a converted code group. The converted code group is a host code group. The pre-conversion code group is a guest code group.
(2) Compare the result of (1) with a line size of a cache, and calculate which line of the cache stores the pre-conversion code group.
(3) Judge a cache hit and a cache miss from the result of (2).

In the present embodiment, conversion from the guest code 201 to the host code 202 is performed by the line size unit; thus, the cumbersome operations as mentioned above are unnecessary, and a cache hit and a cache miss can be judged only by searching the buffer. That is, when the converted code group exists in the buffer, it can be judged that a cache hit occurs, and when the converted code group does not exist in the buffer, it can be judged that a cache miss occurs. Thus, the operation becomes simple and accurate.

In the following, an example of a hardware configuration of the simulation device 100 according to the embodiment of the present invention will be described with reference to FIG. 5.

The simulation device 100 is a computer. The simulation device 100 is equipped with hardware components such as a processor 901, an auxiliary storage device 902, a memory 903, a communication device 904, an input interface 905 and a display interface 906. The processor 901 is connected to the other hardware components via a signal line 910 to control the other hardware components. The input interface 905 is connected to an input device 907. The display interface 906 is connected to a display 908.

The processor 901 is an integrated circuit (IC) that performs processing. The processor 901 is, for example, a CPU, a digital signal processor (DSP), or a graphics processing unit (GPU).

The auxiliary storage device 902 is, for example, a read only memory (ROM), a flash memory, or a hard disk drive (HDD).

The memory 903 is, for example, a random access memory (RAM). The storage medium 110 and the buffer 120 can be realized by the memory 903. Note that the storage medium 110 may be realized by combination of the auxiliary storage device 902 and the memory 903. For example, the guest code 201 may be stored in the memory 903, and information except the guest code 201 such as the penalty information 211 may be stored in the auxiliary storage device 902.

The communication device 904 includes a receiver 921 to receive data and a transmitter 922 to transmit data. The communication device 904 is, for example, a communication chip or a network interface card (NIC).

The input interface 905 is a port whereto a cable 911 of the input device 907 is connected. The input interface 905 is, for example, a universal serial bus (USB) terminal.

The display interface 906 is a port whereto a cable 912 of the display 908 is connected. The display interface 906 is, for example, a USB terminal or a high definition multimedia interface (HDMI (registered trademark)) terminal.

The input device 907 is, for example, a mouse, a stylus pen, a keyboard, or a touch panel.

The display 908 is, for example, a liquid crystal display (LCD).

In the auxiliary storage device 902, a program to realize the functions of the "units" such as the execution unit 130, the processing unit 140 and the calculation unit 150 is stored. The program is loaded into the memory 903, read into the processor 901, and executed by the processor 901. An operating system (OS) is also stored in the auxiliary storage device 902. At least a part of the OS is loaded into the memory 903, and the processor 901 executes the program to realize the functions of the "units" while executing the OS.

In FIG. 5, one processor 901 is illustrated; however, the simulation device 100 may be equipped with a plurality of processors 901. Then, the plurality of processors 901 may execute programs to realize the functions of the "units" cooperatively.

The information, data, signal values and variable values indicating the results of the processing by the "units" are stored in the auxiliary storage device 902, the memory 903, or a register or a cache memory in the processor 901.

The "units" may be provided by "circuitry." Alternatively, the "units" may be replaced with "circuits", "steps", "procedures" or "processes." The "circuits" and "circuitry" are concepts that include not only the processor 901 but also processing circuits of other types, such as a logic IC, a gate array (GA), an application specific integrated circuit (ASIC) and a field-programmable gate array (FPGA).

The above describes the embodiment of the present invention; however, the embodiment may be partially implemented. For example, out of those described as "units" in the description of the embodiment, only one "unit" or an arbitrary combination of some "units" may be employed. Note that the present invention is not limited to the embodiment, and various alterations can be made as needed.

REFERENCE SIGNS LIST

100: simulation device; 110: storage medium; 120: buffer; 130: execution unit; 140: processing unit; 141: block generation unit; 142: buffer search unit; 143: block conversion unit; 150: calculation unit; 151: penalty calculation unit; 152: time calculation unit; 201: guest code; 202: host code; 211: penalty information; 212: time information; 221: code-length information; 222: line information; 231: block information; 232: address correspondence table; 241: size information; 242: algorithm information; 243: structure information; 301: estimated value; 901: processor; 902: auxiliary storage device; 903: memory; 904: communication device; 905: input interface; 906: display interface; 907: input device; 908: display; 910: signal line; 911: cable; 912: cable; 921: receiver; 922: transmitter

The invention claimed is:

1. A simulation method to simulate execution of a program in a system using a cache for reading an instruction in the program, the simulation method comprising:
storing, in a storage medium, guest code wherein the instruction in the program is described in an executable form in the system;
storing, in a buffer, host code wherein the instruction in the program is described in an executable form in the computer;
executing the instruction described in the host code stored in the buffer;
by a computer, when host code wherein a next instruction being an instruction to be executed next is described is not stored in the buffer, reading from the storage medium a guest code group that has a size of a cache line being a unit whereby the instruction in the program is stored in the cache and that includes guest code wherein the next instruction is described, converting the guest code group read, generating a host code group including the host code wherein the next instruction is described, and collectively writing the host code group generated, as a host code block, in the buffer; and
judging whether a free space for storing the host code group generated exists in the buffer, by comparing with a size of the cache a total size of guest code corresponding to one or more host code blocks stored in the buffer, and when the free space does not exist, deleting any of the one or more host code blocks from the buffer.

2. A simulation device to simulate execution of a program in a system using a cache for reading an instruction in the program, the simulation device comprising:
a storage medium to store guest code wherein the instruction in the program is described in an executable form in the system;
a buffer to store host code wherein the instruction in the program is described in an executable form in the simulation device; and
processing circuitry
to execute the instruction described in the host code stored in the buffer,
when host code wherein a next instruction being an instruction to be executed next is described is not stored in the buffer, to read from the storage medium a guest code group with a size of a cache line being a unit whereby the instruction in the program is stored in the cache, the guest code group including guest code wherein the next instruction is described, to convert the guest code group read, to generate a host code group including the host code wherein the next instruction is described, and to collectively write the host code group generated, as a host code block, in the buffer, and
to judge whether a free space for storing the host code group generated exists in the buffer, by comparing with a size of the cache a total size of guest code corresponding to one or more host code blocks stored in the buffer, and when the free space does not exist, delete any of the one or more host code blocks from the buffer.

3. The simulation device as defined in claim 2, wherein the processing circuitry deletes any of the one or more host code blocks from the buffer, by using an algorithm same as an algorithm whereby the system deletes one or some instructions from the cache when a miss occurs in the cache.

4. The simulation device as defined in claim 2,
wherein the processing circuitry calculates an estimated value of an execution time of the program in the system,
wherein the storage medium stores penalty information indicating a read time of the instruction in the program in the system when the miss occurs in the cache, and
wherein the processing circuitry adds to the estimated value the read time indicated by the penalty information stored in the storage medium every time a new host code block is written into the buffer.

5. The simulation device as defined in claim 4, wherein the penalty information is information indicating a time taken for reading the instruction in the program in the system when the miss occurs in the cache, per address range of a memory from which the instruction in the program is read.

6. The simulation device as defined in claim 4,
wherein the storage medium stores time information indicating a time taken for executing the instruction in the program in the system, and
wherein the processing circuitry adds to the estimated value the time indicated by the time information stored in the storage medium every time the instruction described in the host code stored in the buffer is executed.

7. A non-transitory computer readable medium storing a simulation program to simulate execution of a program in a system using a cache for reading an instruction in the program, the simulation program causing a computer including a storage medium to store guest code wherein the instruction in the program is described in an executable form in the system, and a buffer to store host code wherein the instruction in the program is described in an executable form in the computer, to:

execute the instruction described in the host code stored in the buffer;

when host code wherein a next instruction being an instruction to be executed next is described is not stored in the buffer, read from the storage medium a guest code group with a size of a cache line being a unit whereby the instruction in the program is stored in the cache, the guest code group including guest code wherein the next instruction is described, convert the guest code group read, generate a host code group including the host code wherein the next instruction is described, and collectively write the host code group generated, as a host code block, in the buffer; and judge whether a free space for storing the host code group generated exists in the buffer, by comparing with a size of the cache a total size of guest code corresponding to one or more host code blocks stored in the buffer, and when the free space does not exist, delete any of the one or more host code blocks from the buffer.

* * * * *